United States Patent [19]
Oehrlein et al.

[11] Patent Number: 5,637,237
[45] Date of Patent: Jun. 10, 1997

[54] METHOD FOR HOT WALL REACTIVE ION ETCHING USING A DIELECTRIC OR METALLIC LINER WITH TEMPERATURE CONTROL TO ACHIEVE PROCESS STABILITY

[75] Inventors: Gottlieb S. Oehrlein, Yorktown Heights, N.Y.; David Vender, Eindhoven, Netherlands; Ying Zhang, Petaluma, Calif.; Marco Haverlag, Heindhoven, Netherlands

[73] Assignee: International Business Machines Corporation, Armonk, N.Y.

[21] Appl. No.: 473,507

[22] Filed: Jun. 7, 1995

Related U.S. Application Data

[62] Division of Ser. No. 208,158, Mar. 8, 1994.

[51] Int. Cl.[6] .................................................. H01L 21/30
[52] U.S. Cl. .......................... 216/67; 438/905; 438/706
[58] Field of Search .............................. 156/646.1, 643.1, 156/345, 662.1; 216/67; 134/1.1

[56] References Cited

U.S. PATENT DOCUMENTS

| 4,419,201 | 12/1983 | Levinstein et al. | 156/345 |
|---|---|---|---|
| 4,693,777 | 9/1987 | Hazano et al. | 156/345 |
| 4,859,304 | 8/1989 | Cathey et al. | 156/345 |
| 4,971,653 | 11/1990 | Powell et al. | 156/345 |
| 5,039,376 | 8/1991 | Zukotynski et al. | 156/345 |

FOREIGN PATENT DOCUMENTS

| 322095 | 2/1991 | Germany . |
|---|---|---|
| 53-72541 | 6/1978 | Japan . |
| 61-289634 | 12/1986 | Japan . |
| 62-030329 | 2/1987 | Japan . |
| 63-005526 | 1/1988 | Japan . |
| 63-169029 | 7/1988 | Japan . |
| 63-312642 | 12/1988 | Japan . |
| 1165120 | 6/1989 | Japan . |
| 2016730 | 1/1990 | Japan . |
| 3050723 | 3/1991 | Japan . |
| 3-285087 | 12/1991 | Japan . |
| 4316327 | 11/1992 | Japan . |
| 5243167 | 9/1993 | Japan . |
| 5283368 | 10/1993 | Japan . |
| 6124918 | 5/1994 | Japan . |

OTHER PUBLICATIONS

R.G. Frieser, W.H. Ma, G.M. Ozols and B.N Zingerman, "IBM Technical Disclosure Bulletin", *Polymerization Detection In Reactive Ion Etching*, (Feb. 1982).

H.J. Geipel, "IBM Technical Disclosure Bulletin", *End-Point Detection For Reactive Ion Etching*, (Jul. 1977).

"Plasma Cleaning By Use of Hollow Cathode Discharge In a Trifluoromethane–Silicon Dioxide Dry Etching System"; Jap. J. Appl. Phys., Part 1 (1992), 31 (5A), pp. 1491–1498; Watanabe.

*Primary Examiner*—R. Bruce Breneman
*Assistant Examiner*—George Goudreau
*Attorney, Agent, or Firm*—Ratner & Prestia

[57] ABSTRACT

The present invention relates to a method and apparatus for etching semiconductor devices where the undesirable deposition of films on the internal surfaces of the apparatus are prevented during the etching process. The system for etching devices provides an etching chamber having a deposition resistant surface, a holder for holding the device to be etched, and a heater for heating the deposition resistant surface to a temperature between 100 C to 600 C to impede the formation of films on the walls of the chamber. The etching system may further include the deposition resistant surface surrounding the holder while not interfering with the plasma used to etch the substrate.

17 Claims, 3 Drawing Sheets

5,637,237

METHOD FOR HOT WALL REACTIVE ION ETCHING USING A DIELECTRIC OR METALLIC LINER WITH TEMPERATURE CONTROL TO ACHIEVE PROCESS STABILITY

This application is a division of application Ser. No. 08/208,158, filed Mar. 8, 1994, (status: pending).

FIELD OF THE INVENTION

This invention relates to semiconductor manufacture, particularly, the prevention of the formation of undesirable films on the surfaces of etching chambers exposed to plasma while etching semiconductor devices.

BACKGROUND THE INVENTION

To overcome the shortcomings of prior art etching chambers, a new method and apparatus for etching semiconductor devices is provided.

Plasma dry etch reactors are vacuum chambers in which an electrical plasma is created in order to etch semiconductor wafers. The etching is usually performed through a photoresist mask.

Dry etching techniques are often referred to as reactive ion etching or plasma etching. Prior art dry etchers form a plasma by injecting precursor gases into an area where a RF Field is produced. The precursor gases may include fluorine containing gases, for example, $CHF_3$ or $CF_4$.

The RF field can be generated by two or three internal electrodes coupled to a RF source, or by means of external electrodes or a coil. The high frequency excitation causes the precursor gases to change into the plasma which generates ions and reactive species. The reactive species created diffuse to the surfaces to be etched where the etching is chemical. In ion-assisted processes, the semiconductor devices are exposed to the energetic ions of the plasma. The ions are directed at the semiconductor device where the ions then collide with the substrates causing portions of the surface of the substrate to etch, or chip, off. The ion-assisted etching processes involve both chemical and physical etching.

During the etching process, fluorocarbon films are deposited onto the walls of the etching chamber. The deposition of the fluorocarbon films changes the impedance of the system and over time results in a decrease of the self-biasing voltage of the etching chamber. This changes the operational characteristics of the etcher affecting the etching process. Additionally, the fluorocarbon film deposited on the walls of the etching chamber may flake off and become a source of particles within the etching chamber.

The deposition of fluorocarbon films on the etching chamber walls is conventionally dealt with by cleaning the etching chamber using an $O_2$ plasma and subsequently reconditioning the etching chamber. The chamber cleaning and seasoning process can require up to 30 percent of the total system up-time.

Some prior art designs have provided methods and/or apparatuses in an attempt to eliminate some of the problems caused by the deposition of the fluorocarbon films onto the surfaces within the etching chamber. For example, in one system a substrate to be etched is placed within the etching chamber and cooled while the walls of the chamber are heated to a temperature of approximately 80 C. Heating of the surfaces is accomplished by supplying hot water to a pipe mounted on the outer surfaces of the dry etching device. This is done to reduce bonding of a polymer film to the walls of the etching device while the substrate is being etched.

However, this method and/or apparatus will only reduce the deposition rate of the fluorocarbon films on the inner walls of the chamber marginally. Furthermore, where high-density plasma tools are employed during the etching process, a partial elimination of the deposition rate of, for example, 10 to 20 percent by heating to 80 C, will still result in a high frequency of cleaning for the etching chamber.

SUMMARY OF THE INVENTION

The present invention relates to a method and apparatus for etching semiconductor devices where the undesirable deposition of films on the internal surfaces of the apparatus are prevented during the etching process.

The etching system includes an etching chamber having a deposition resistant surface, a holder for holding the device to be etched, and a heater for heating the deposition resistant surface to a temperature between 100 C to 600 C to impede the formation of films on the walls of the chamber. The etching system my further include the deposition resistant surface surrounding the holder while not interfering with the plasma used to etch the substrate.

BRIEF DESCRIPTION OF THE DRAWING

The invention is best understood from the following detailed description when read in connection with the accompanying drawings wherein like reference numerals refer to like elements throughout, in which:

FIG. 3b is a cross-sectional view along line AA of the second exemplary embodiment of the present invention in FIG. 3a.

FIG. 3c is a cross-sectional view along line BB of the second exemplary embodiment of the present invention in FIG. 3a.

DETAILED DESCRIPTION OF THE INVENTION

Figure 1:
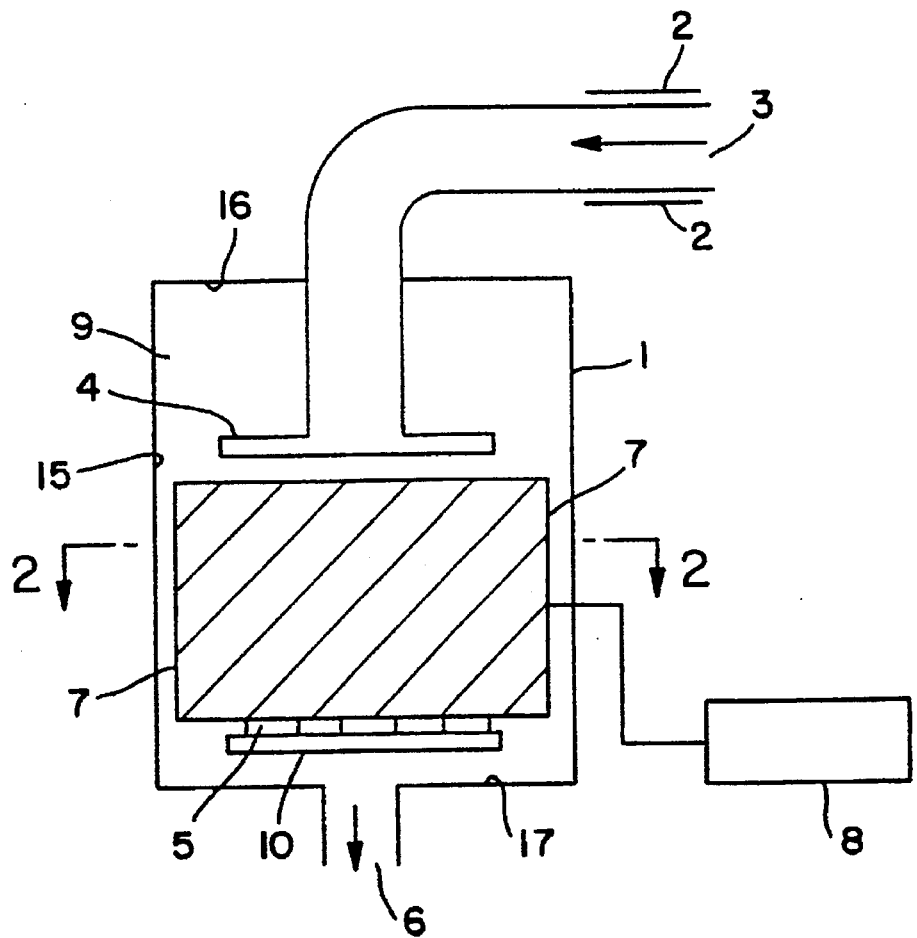
FIG. 1 is a schematic view of a first exemplary embodiment of the present invention.

FIG. 1 shows a downstream type plasma etcher which is generally designated 1. The downstream plasma etcher 1 includes electrodes 2 which surround a gas inlet 3 for generating plasma. Gas inlet 3 provides a supply of fluorine containing gases such as $CF_4$ and $CHF_3$. As the fluorine containing gas passes through electrodes 2, the gas is transformed into a plasma. Nozzle 4 disperses the gas into the etching chamber 9. Opposite Nozzle 4 and located in etching chamber 9 is substrate holder 10 for holding substrates 5 to be etched. Outlet 6 is also provided to exhaust the plasma.

Surrounding Nozzle 4 and substrate holder 10 and disposed in etching chamber 9 is liner 7 for protecting walls 15, 16 and 17 of etching chamber 9. Liner 7 is an etch resistant material which can be heated. Liner 7 is coupled to a heating source 8 for heating liner 7 during the etching process. The heating source 8, for example, may comprise an electrical heating source for heating liner 7 using resistive heating or a heating lamp. Alternatively, heating source 8 may include a liquid which is heated and circulated around or through liner 7.

Instead of providing an external heating source, a heating source may be incorporated into liner, thus, eliminating the need for a separate heating source.

Heating source 8 includes a control element for controlling and maintaining the temperature of liner 7. For example, a probe such as a thermocouple (not shown) may be disposed in etching chamber 9 in close proximity to liner 7 for determining the temperature of liner 7. The control element within external heating source 8 adjusts the heat supplied to or generated by liner 7 in response to temperature data received from the thermal couple to maintain the liner 7 at a desired temperature.

Maintaining liner 7 at a particular temperature using a feedback system such as the control element becomes particularly important during the etching process. During etching the generated plasma will provide an additional source of heat which will heat liner 7. To compensate for the heat generated by the plasma, the control element would reduce the heat supplied by heating source 8 to liner 7. Thus, providing feedback control for maintaining the temperature of liner 7.

Many different methods and/or apparatus can be envisioned for controlling and maintaining the temperature of liner 7 in combination with heating source 8. These may include, for example, manual or automatic controls or a combination thereof for maintaining the desired temperature in the chamber. The control element may be implemented by computer hardware and/or software.

Figure 2:
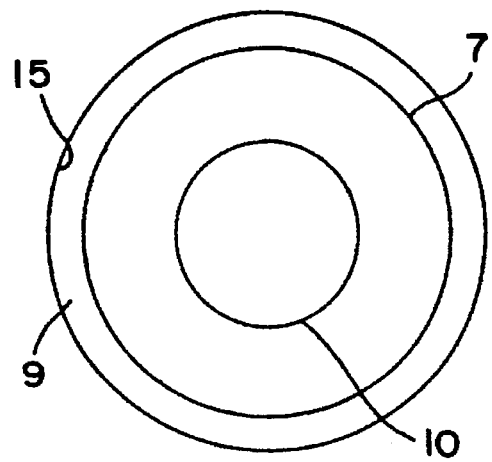
FIG. 2 is a cross-sectional view along line AA of the first exemplary embodiment of the present invention in FIG. 1.

FIG. 2 shows a cross-sectional view of FIG. 1 along line AA. In this view, substrates 5 have been omitted from FIG. 2 for clarity.

FIG. 2 shows holder 10 encircled by liner 7 shielding walls 15, 16 and 17 of etching chamber 9. In this way liner 7 prevents walls 15, 16, 17 from being exposed to plasma and the byproducts of the etching process which results in film deposition on walls 15, 16 and 17.

FIG. 2 also shows liner 7 as one continuous surface disposed within the etching chamber 9. However, liner 7 may be formed from two or more individual components which are disposed in etching chamber 9 to protect the etching chamber surfaces. It is preferred that liner 7 protects as much surface area of walls 15, 16 and 17 so long as liner 7 does not interfere with the plasma generated in etching chamber 9 to etch substrates 5. For example, liner 7 should not interfere with the line of sight between the plasma generated and substrates 5.

In addition, liner 7 may be controlled by one heating source coupled to a liner having individual components or two or more heating sources 8 may be provided for heating liner 7 as a whole, individually or as a subset group.

In operation, substrates 5 are disposed within etching chamber 9 on substrate holder 10. Liner 7 is heated to an elevated temperature using heater 8 which heats liner 7 up to an approximate temperature of 300 C for fluorocarbon oxide etching processing. Although temperatures of about 300 C are preferred, temperatures ranging from 100 C to 600 C are desirable because significant decreases in the deposition of the fluorocarbon on the liner 7 is experienced in this range.

After liner 7 has reached the desired temperature, the etching process is initiated by passing the gas through electrodes 2 which generate an RF field which excites the gas and causes it to change into plasma. Liner 7 is maintained at an elevated temperature during the etching process so that the deposition of fluorocarbon films on walls 15, 16 and 17 of etching chamber 9 and liner 7 is severely impeded.

The control element monitors and maintains the temperature of liner 7 by monitoring the temperature data provide by the probe. In response to the probe temperature data, the amount of heat supplied by heating source 8 to liner 7 is adjusted accordingly to maintain the desired temperature for liner 7.

The use of liner 7 heated to a temperature of 300 C results in an increase in the process window for the plasma etcher 1. The process window is the set of constraints under which the plasma etcher operates. These constraints include, but are not limited to, the length of time for which the chamber may be operated for etching, the types of gas mixtures that can be used, and the power at which the system can be operated.

Using liner 7 reduces system down time for cleaning thus increasing overall available operational time of the plasma etcher for etching. This occurs because a drastic reduction in the deposition of the fluorocarbon films on walls 15, 16 and 17 of the etching chamber is experienced with the use of liners heated to 300 C. Thus, a corresponding decrease in tool down time for etching chamber cleaning is experienced.

In prior art methods, films deposited on etching chamber walls would be removed using an $O_2$ plasma and subsequently reconditioning the etching chamber. This process would require 30 percent of the total system up-time. However, using liner 7 in accordance with the exemplary embodiment results in decreased down time for plasma etcher 1.

In addition, fluorocarbon films which would not normally be used for etching may be used in conjunction with the liner 7. For example, during oxide etching gases such as $C_2F_4$, $C_2F_6$, $C_2F_8$ and $C_2HF_5$ can be used for their higher selectivity in etching the semiconductor devices. However, these gases have the undesirable side effect of causing large amounts of fluorocarbon films to be deposited on the on the exposed surfaces of the etching chamber. To overcome this problem, these gases may be used in conjunction with liner 7 which severely inhibit the formation of the fluorocarbon films.

Also, one etching chamber may be operated at increased power levels where the excitation of the gas occurs at higher energy levels. The higher power levels provide a higher etching rate but cause an increase in the deposition of fluorocarbon films. However, the deposition of fluorocarbon films is significantly reduced using a liner heated to 300 C.

In addition, inherent instability in the etching process using fluorocarbon gases is reduced because the deposition of fluorocarbon films is severely impeded during the etching process. Since the rate of formation of fluorocarbon films on etching chamber walls is significantly reduced, the etching impedance is not altered during etching.

In an alternative embodiment, the walls of etching chamber 9 shown in FIG. 1 may be heated to an elevated temperature without disposing a separate liner surface within the chamber. Heating of etching chamber 9 would be accomplished in a similar manner as the first exemplary embodiment where liner 7 is used in etching chamber 9. In this embodiment, the walls of the chamber would be heated to 300 C achieving the same desirable effects as when liner 7 is heated. Alternatively, liner 7 could be disposed on walls 15, 16 and 17.

The type of plasma etcher in which the heated liner my be used is not limited to downstream etchers, but may be used in a wide variety of etching apparatus, for example, parallel electrode reactors, barrel etchers cylindrical batch etch reactors and magnetron ion etchers. In addition, a high density plasma source can be used in conjunction with a resonance frequency biasing. The high density plasma may be for example an electron resonance plasma or a coupled resonance frequency plasma.

Figure 3A:
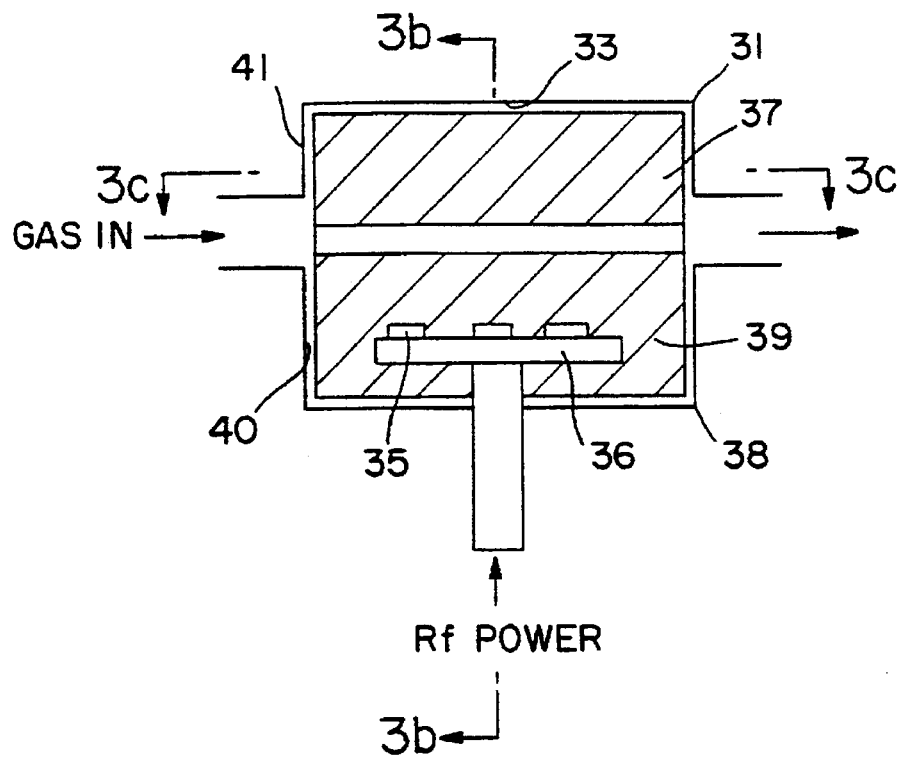
FIG. 3a is schematic view of a second exemplary embodiment of the present invention.
Figure 3B:
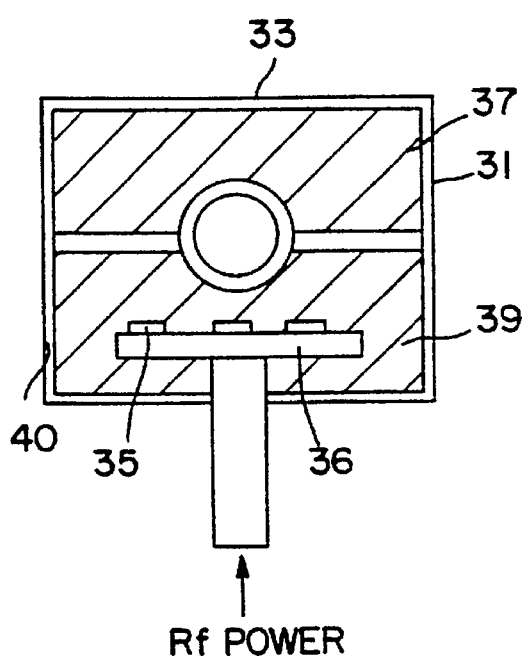
Figure 3C:
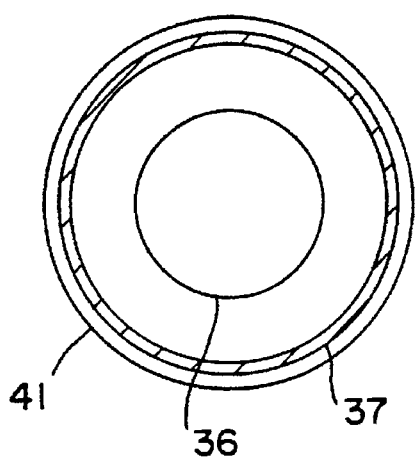

A second exemplary embodiment of the present invention is shown in FIGS. 3a–3c. The parallel-plate electrode etcher 31 includes electrode 36 which also serves as the substrate holder. The second electrode 33 is connected to ground and is also the upper wall of the etching chamber 38. Plasma is generated between electrodes 33, 36 above substrates 35 during the etching process.

A liner comprising components 37, 39 is disposed in etching chamber 38 to prevent the deposition of fluorocarbon films onto the exposed walls 40, 41 of the etching chamber 38.

In operation, the embodiment shown in FIGS. 3a–3c prevents the formation of fluorocarbon films in a similar manner as the first exemplary embodiment shown in FIG. 1. As for the first exemplary embodiment, this embodiment uses an external heating source (not shown) for heating liner 37, 39. The liner surface is heated to a temperature of 300 C prior to the initiation of the etching process.

The liner and/or the walls of the etching chamber for the first and second exemplary embodiments can be constructed from a wide variety of materials, for example, ceramics, aluminum, steel and/or quartz. Aluminum is the preferred material because it is easy to machine. However, aluminum is reactive to the plasma generated from some of the precursor gases used during the etching process. Thus, aluminum oxide or a coating thereof disposed on the liner or chamber walls is used because aluminum oxide is chemically inert to the plasma.

In addition to the materials used to construct the liner and/or chamber walls, a protective coating can be applied to the surfaces of the liner and/or the chamber walls. For example, $Al_2O_3$, $Sc_2O_3$, or $Y_2O_3$ may be used as coating materials for the exposed surfaces. These materials are selected for their etching resistance to the plasma generated during the etching process.

The criteria for selecting the above materials and/or coating is based upon the material and/or coatings resistance to chemical attack of the species created in the plasma by excitation of the precursor gas during the etching process and the ability material and/or coating to prevent the formation of particles which may flake off the surface or material within the etching chamber.

For example, aluminum oxide is an important coating material because it is chemically inert to the fluorocarbon gases used in some etching processes. In addition, it is a good material for coating aluminum which is often used to construct the etching chamber.

The liner should be disposed within the etching chamber to shield the largest amount of surface are of the etching chamber against the formation of fluorocarbon films without interfering with the etching of the semiconductor devices. Thus, for the second exemplary embodiment shown in FIG. 3a–3c, the liner comprises several individual components to ensure maximum coverage of surfaces of the etching chamber while not interfering with the plasma that is generated. Alternatively, one continuous liner may be appropriate, as shown in the first exemplary embodiment of FIG. 1, for covering the surfaces of the etching chamber.

Although all of the surfaces of the etching chamber do not have to be shielded by the liner, it is desired that the surfaces be shielded to the greatest possible extent to prevent the deposition of fluorocarbon films.

Figure 4:
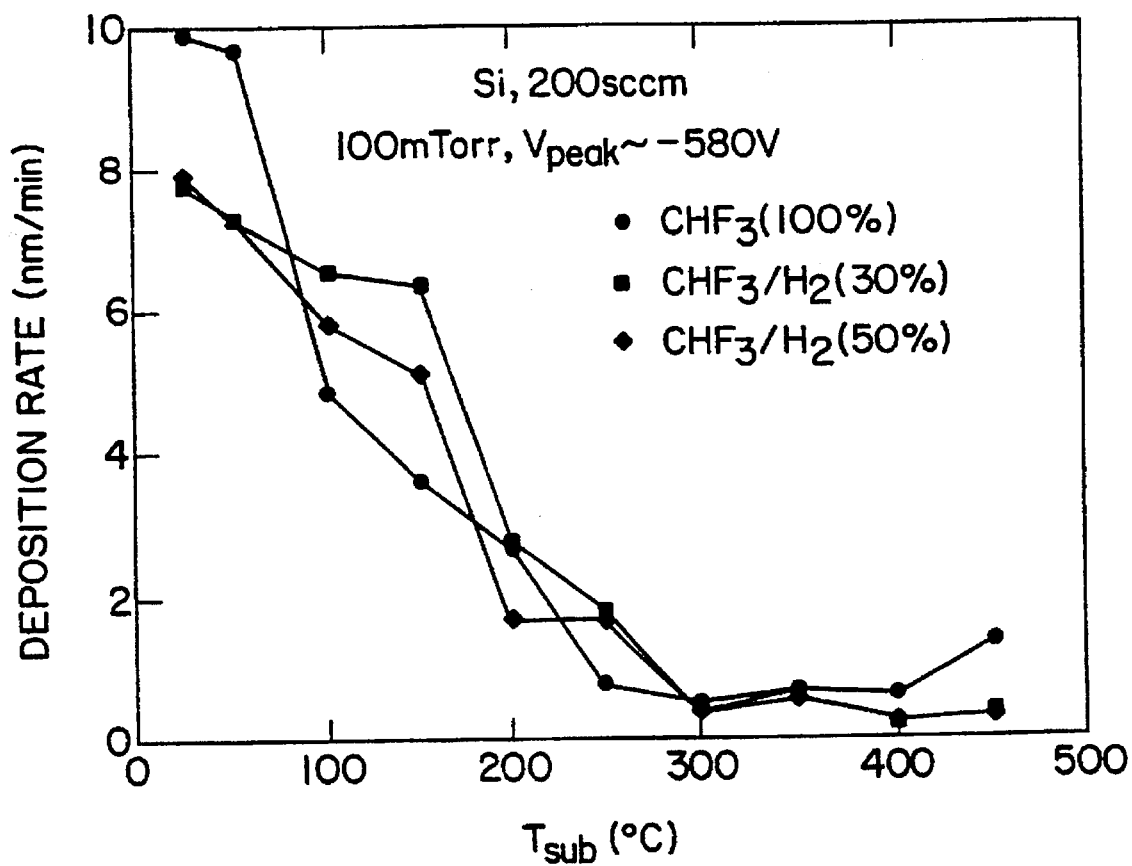
FIG. 4 is a diagram showing the deposition rate of the films on a heated surface within an etching chamber versus the temperature of that surface using three different etching gases.

FIG. 4 shows the results obtained when a surface disposed within an etching chamber is heated to an elevated temperature. A silicon substrate was etched at a pressure of 100 mTorr where the peak voltage during the etching process was approximately −580 V. For comparison, three different gas were used to generate the plasma including $CHF_3$ (100%), $CHF_3/H_2$(30%) and $CHF_3/H_2$(50%). The figure compares the deposition rate of fluorocarbon films using the three different gases. As can be seen for the three different gases, the deposition rate of the fluorocarbon films on the heated surface decreased to nearly zero at 300 C from a deposition rate of approximately 10 nm/min at room temperature. In addition, although some reduction in the deposition rate is achieved below 100 C, temperatures beyond 100 C and up to and over 300 C show a substantial reduction in the deposition rate.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method for impeding the deposition of undesirable films in an etching system, said method comprising the steps of:

providing an etching chamber having one of a surface defining the etching chamber and a surface disposed in said etching chamber;

heating said surface to a temperature between 290° C. to 310° C. to prevent the formation of a deposition film on said surface during etching; and generating a plasma for etching using a fluorocarbon gas.

2. The method of claim 1, wherein said surface is the wall of the etching chamber.

3. The method of claim 2, wherein said surface is coated with $Al_2O_3$.

4. The method of claim 1, wherein said surface is coated with a material to reduce erosion of said surface in said plasma.

5. The method of claim 4, wherein said surface is coated with a material selected from the group consisting of $Al_2O_3$, $Y_2O_3$ and $Sc_2O_3$.

6. The method of claim 5, wherein said surface is coated with $Al_2O_3$.

7. A method for impeding the deposition of undesirable films in an etching system, said method comprising the steps of:

providing an etching chamber having one of a surface defining the etching chamber and a surface disposed in said etching chamber;

heating said surface to a temperature between 290° C. to 310° C. to prevent the formation of a deposition film on said surface during etching;

generating a plasma comprised of a fluorocarbon gas for etching; and etching an oxide on the substrate using the plasma.

8. The method of claim 1, wherein said surface is a liner disposed in the etching chamber.

9. A method for impeding the deposition of undesirable films in an etching system, said method comprising the steps of:

providing an etching chamber having a liner disposed in said etching chamber where said liner is coated with a material to reduce erosion of said surface in a plasma;

heating said surface to a temperature between 290° C. to 310° C. to prevent the formation of a deposition film on said surface during etching; and generating said plasma for etching using a fluorocarbon gas.

10. The method of claim 9, wherein said liner is coated with $Sc_2O_3$.

11. The method of claim 9, wherein said liner is coated with $Y_2O_3$.

12. The method of claim 9, wherein said liner is coated with $Al_2O_3$.

13. A method for impeding the deposition of undesirable films in an etching system, said method comprising the steps of:

providing an etching chamber having one of a surface defining the etching chamber and a surface disposed in said etching chamber where said surface is coated with $Y_2O_3$ to reduce erosion of said surface in a plasma;

heating said surface to a temperature between 290° C. to 310° C. to prevent the formation of a deposition film on said surface during etching; and generating said plasma for etching using a fluorocarbon gas.

14. A method for impeding the deposition of undesirable films in an etching system, said method comprising the steps of:

providing an etching chamber having one of a surface defining the etching chamber and a surface disposed in said etching chamber where said surface is coated with $Sc_2O_3$ to reduce erosion of said surface in a plasma;

heating said surface to a temperature between 290° C. to 310° C. to prevent the formation of a deposition film on said surface during etching; and generating said plasma for etching using a fluorocarbon gas.

15. A method for impeding the deposition of undesirable films in an etching system, said method comprising the steps of:

providing an etching chamber having one of a surface defining the etching chamber and a surface disposed in said etching chamber;

heating said surface to a temperature between 290° C. to 310° C. to prevent the formation of a deposition film on said surface during etching; and generating a plasma for etching using a gas selected from the group consisting of $CHF_3(100\%)$, $CHF_3/H_2(30\%)$ and $CHF_3/H_2(50\%)$.

16. A method for impeding the deposition of undesirable films in an etching system, said method comprising the steps of:

providing an etching chamber having a surface defining a wall of the etching chamber where said surface is coated with $Sc_2O_3$;

heating said surface to a temperature between 290° C. to 310° C. to prevent the formation of a deposition film on said surface during etching; and generating a plasma for etching using a fluorocarbon gas.

17. A method for impeding the deposition of undesirable films in an etching system, said method comprising the steps of:

providing an etching chamber having a surface defining a wall of the etching chamber where said surface is coated with $Y_2O_3$;

heating said surface to a temperature between 290° C. to 310° C. to prevent the formation of a deposition film on said surface during etching; and generating a plasma for etching using a fluorocarbon gas.

\* \* \* \* \*